United States Patent
Koniaris et al.

(10) Patent No.: US 9,024,699 B2
(45) Date of Patent: May 5, 2015

(54) NUMERICALLY-CONTROLLED OSCILLATOR

(71) Applicant: Apple Inc., Cupertino, CA (US)

(72) Inventors: Kleanthes G. Koniaris, Cupertino, CA (US); Erik P. Machnicki, San Jose, CA (US); Shane J. Keil, San Jose, CA (US)

(73) Assignee: Apple Inc., Cupertino, CA (US)

( * ) Notice: Subject to any disclaimer, the term of this patent is extended or adjusted under 35 U.S.C. 154(b) by 144 days.

(21) Appl. No.: 13/746,247

(22) Filed: Jan. 21, 2013

(65) Prior Publication Data
US 2014/0203884 A1 Jul. 24, 2014

(51) Int. Cl.
*H03K 3/64* (2006.01)

(52) U.S. Cl.
CPC ........................................ *H03K 3/64* (2013.01)

(58) Field of Classification Search
USPC .................. 331/177 R; 327/299; 375/376
See application file for complete search history.

(56) References Cited

U.S. PATENT DOCUMENTS

| 7,711,328 | B1 | 5/2010 | Samad |
| 7,746,972 | B1 | 6/2010 | Melanson et al. |
| 7,826,582 | B2 | 11/2010 | Kuhns et al. |
| 2010/0052797 | A1* | 3/2010 | Carley et al. ................. 331/18 |
| 2012/0200326 | A1 | 8/2012 | Buhmann et al. |

* cited by examiner

*Primary Examiner* — Joseph Chang
*Assistant Examiner* — Jeffrey Shin
(74) *Attorney, Agent, or Firm* — Meyertons, Hood, Kivlin, Kowert & Goetzel, P.C.

(57) ABSTRACT

Various techniques for generating an output clock based on a reference clock. This disclosure relates to generating an output clock signal based on a reference clock signal. In one embodiment, a method includes generating, using information received from a control circuit, an output clock signal using both a first number of edges or an input clock signal and a second, different number of edges of the input clock signal. In this embodiment, the control circuit runs at a frequency that is less than a frequency of the input clock signal. The received information may indicate, for a pulse of the output clock signal, whether the pulse should be generated using the first number of edges or the second number of edges. In some cases, the second number of edges may be the first number of edges plus one. The first and second number of edges may be programmable quantities.

23 Claims, 6 Drawing Sheets

$f$ = input clock frequency = 2400 MHz $\Delta$ = duration of input half-cycle = $1/(2f)$ = 208.333 ps $g$ = desired output frequency = 128 x 44.1kHz = 5.6448 MHz $T$ = desired output period = $1/g$ = $(2f/g)\Delta$ = 850.3402$\Delta$ $N$ = 850/2 = 425 ; $\varphi$ = 0.3402/2 = 0.1701

L, S, S, S, S, S, L, S, S, S, S, S, L, S, S, S, S, S, L, S, S, S, S

L, S, S, L, S, S, S, S, S, S, L, S, S, S, S, S, L, S, S, S, L, S, S

NUMERICALLY-CONTROLLED OSCILLATOR

BACKGROUND

1. Technical Field

This disclosure relates generally to synchronous circuits and more particularly to numerically-controlled oscillators.

2. Description of the Related Art

Numerically-controlled oscillators (NCO's) are often used for timing digitization of analog signals, among many other uses. For example, NCO's are configured to generate a clock of a particular frequency from a reference clock by dividing a higher-speed reference clock down to the particular frequency. Typically, a NCO with a higher-frequency reference/input clock may achieve a more accurate output frequency with less jitter compared to a NCO with a lower-frequency input clock. However, a NCO with a higher-frequency input clock may consume more power.

SUMMARY

This disclosure relates to generating an output clock signal based on a reference clock signal. In one embodiment, a method includes generating, using information received from a control circuit, an output clock signal using both a first number of edges of an input clock signal and a second, different number of edges of the input clock signal. In this embodiment, the control circuit runs at a frequency that is less than a frequency of the input clock signal. The received information may indicate, for a pulse of the output clock signal, whether the pulse should be generated using the first number of edges or the second number of edges. The second number of edges may be the first number of edges plus one. The method may further include counting either the first number of edges or the second number of edges based on the information and toggling the output clock signal based on the counting.

In one embodiment, a numerically-controlled oscillator (NCO) includes a control circuit configured to generate control information using a first input clock. In this embodiment, the NCO includes a clock generator circuit configured to generate an output clock pulse corresponding to either N edges of a second input clock or N+1 edges of the second input clock based on the control information. In this embodiment the frequency of the second input clock is greater than the frequency of the first input clock. The number N may be programmable.

In one embodiment, an apparatus includes multiple control circuits and a clock generator circuit. The control circuits may be configured to implement different algorithms to generate control information for the clock generator circuit.

As one non-limiting example, Consider a clock generator circuit that has an input clock with a frequency of 2400 MHz. Further consider that the desired output frequency is 5.6448 MHz. In this example, the desired output frequency cannot be achieved by simply utilizing one out of every N input clock pulses or edges—the value 2,400 divided by 5.6448 is not an integer. Instead because this value is between the integers 425 and 426, the clock generator circuit in this example may use either 425 input clock or 426 input clocks based on control information generated by a control circuit running at a lower frequency than 2400 MHz. Embodiments of the present disclosure may produce a high-precision output clock while lowering power consumption of the NCO.

This specification includes references to "one embodiment," "an embodiment," "one implementation," or "an implementation." The appearances of these phrases do not necessarily refer to the same embodiment or implementation. Particular features, structures, or characteristics may be combined in any suitable manner consistent with this disclosure.

Further, as used herein, the terms "first," "second," "third," etc. do not necessarily imply an ordering (e.g., temporal) between elements. For example, a reference to a "first" number of clock edges and a "second" number of clock edges may refer to any two different numbers of clock edges. In short, references such as "first," "second," etc. are used as labels for ease of reference in the description and the appended claims.

Various elements are indicated in this disclosure as being "configured to" perform one or more tasks. As used herein, the term "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component.

DETAILED DESCRIPTION

Figure 1:
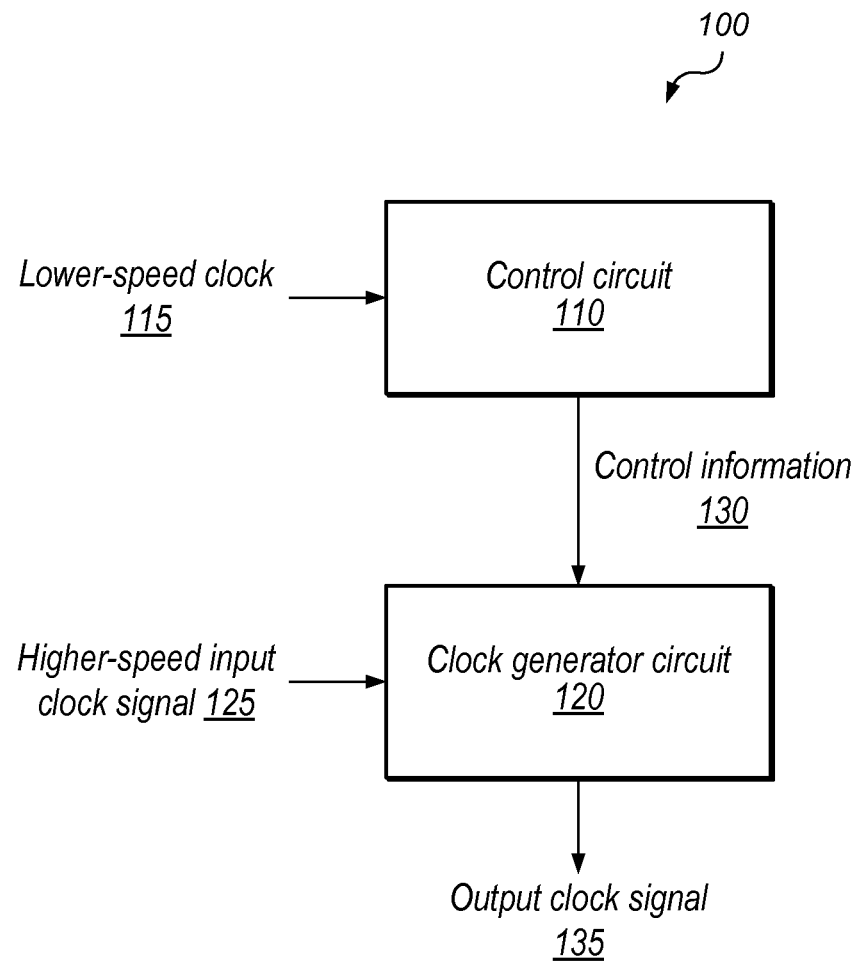
FIG. 1 is a block diagram illustrating one embodiment of a system for generating an output clock signal.

Referring to FIG. 1, a block diagram illustrating one embodiment of a system 100 for generating an output clock signal is shown. In the illustrated embodiment, system 100 includes control circuit 110 and generator circuit 120. In the illustrated embodiment, control circuit 110 is configured to receive lower-speed clock 115, which is measured relative to input clock signal 125, meaning that clock 115 runs at a lower frequency than clock signal 125. In the illustrated embodiment, clock generator circuit 120 is configured to receive higher-speed clock input 125 and generate output clock signal 135 based on higher-speed input clock signal 125 and control information 130.

As used herein, the terms "clock" and "clock signal" refer to a periodic signal, e.g., as in a two-valued (binary) electrical signal. A clock periodically changes between "levels" of the clock such as voltage ranges of an electrical signal. For example, voltages greater than 0.7 volts may be used to represent one clock level and voltages lower than 0.3 volts may be used to represent another level in a binary configuration.

As used herein, the term "clock edge" refers to a change in a clock signal from one level to another level. As used herein, the term "toggle" in the context of a clock signal refers to changing the value of the clock signal from one level to another level in a binary clock configuration. As used herein, the term clock "pulse" refers to an interval of a clock signal between consecutive edges of the clock signal (e.g., an interval between a rising edge and a falling edge or an interval between a falling edge and a rising edge).

In one embodiment, clock generator circuit 120 may be configured to generate output clock signal 135 using both a first number of edges of input clock 125 (e.g., N) and a second number of edges of input clock 135 (e.g., N+1). For example in a situation in which input clock signal has a frequency of 2400 MHz and the desired frequency of output clock signal 135 is 128×44.1 kHz (5.6448 MHz), clock generator circuit may be configured to generate output clock signal 135 by toggling output clock signal 135 every 425 or 426 input clock edges (in this situation N=425, which may be referred to as "drawing short" and N+1=426 which may be referred to as "drawing long"). Because neither number produces exactly the desired output frequency (2400 MHz divided by 5.6448 MHz is between 425 and 426), clock generator circuit 120 may be configured to switch between them (by sometimes drawing short and sometimes drawing long) in order to produce a desired frequency on average. This exemplary situation is described in greater detail below with reference to FIG. 6. In one embodiment, clock generator circuit 120 uses either the first number of the second number of clock edges for a given output clock pulse based on control information 130 received from control circuit 110.

Various embodiments are described herein using the N and N+1 nomenclature for first and second numbers of input clock edges used by clock generator circuit 120. In some embodiments, using N and N+1 as the numbers for the first and second numbers of clock edges may maximize output clock precision (compared to using N and N+x, where x is not 1). However, N and N+1 as first and second numbers are intended to be exemplary and do not foreclose use of other numbers (e.g., N and N+4) as first and second numbers of clock edges in other embodiments.

In one embodiment, clock generator circuit 120 may include a counter for counting input clock edges of input clock signal 125. In one embodiment, the counter is implemented using a linear feedback shift register (LFSR). As used herein, the term "linear feedback shift register" includes its well-known meaning in the art, and refers to a shift register having an input bit that is a linear function of the shift register's previous state. Use of a LFSR instead of a traditional counter may allow use of a higher frequency input clock signal 125. In other embodiments, any of various types of counters may be used to count input clock edges, as desired. In some embodiments, both rising and falling clock edges are counted. In other embodiments, only rising, or only falling edges may be counted, as desired.

Control circuit 110 may implement various algorithms for determining when clock generator circuit 120 should use the first or second number of input clock edges (i.e., draw short or draw long). Such algorithms may be random or pseudo-random in order to break up patterns in output clock signal 135 and thus reduce artifacts in digitized audio signals, for example. Control circuit 110 may send control information based on the determination to clock generator circuit 120. In the illustrated embodiment, control circuit runs at a lower frequency than input clock signal 125 (i.e., clocked circuitry in control circuit 110 uses an input clock having a slower frequency than the input clock signal 125 to clock generator circuit 120).

As used herein, the term "pseudo-random" algorithm refers to an algorithm that produces a result that appears to be random, but is not actually random. Like a random algorithm, a pseudo-random algorithm may provide a relatively uniform distribution among a set of outputs over time. Unlike a random algorithm, the output of a pseudo-random algorithm is known if the inputs are known.

Running control circuit 110 and clock generator circuit 120 at different frequencies may allow greater precision in output clock signal 135 while reducing power consumption by system 100.

Figure 2:
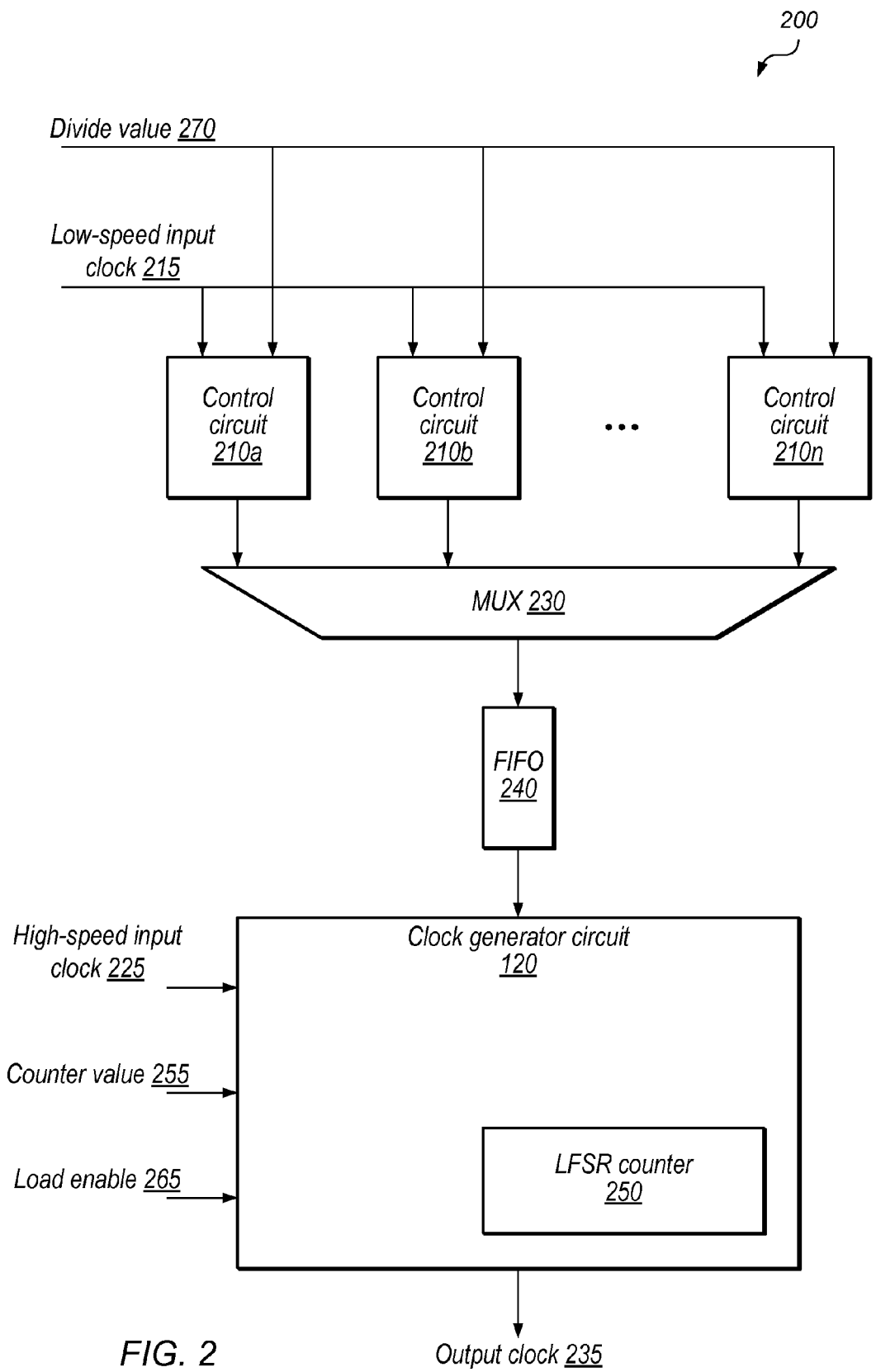
FIG. 2 is a block diagram illustrating one exemplary embodiment of a numerically-controlled oscillator with multiple control circuits.

Referring now to FIG. 2, a block diagram illustrating one embodiment of a system 200 that includes multiple control circuits is shown. In the illustrated embodiment, system 200 includes clock generator circuit 120, control circuits 210a-210n, multiplexer (MUX) 230, and first-in-first-out storage element (FIFO) 240. Control circuits 210a-210n may be referred to individually as a control circuit 210 or collectively as control circuits 210. System 200 may include any of various appropriate numbers of control circuits. In the illustrated embodiment, (MUX) 230 is coupled to control circuits 210 and FIFO 240. In the illustrated embodiment, FIFO 240 is coupled to clock generator circuit 120, which includes linear feedback-shift-register (LFSR) counter 250. System 200 may be configured to generate output clock signal 235 based on various input signals as well as commands from one or more of control circuits 210.

Control circuits 210 may be configured to implement any of various algorithms for determining when clock generator circuit 120 should draw short or draw long. In one embodiment, different control circuits implement different algorithms, and MUX 230 is used to select the output of one of control circuits 210 in order to select an algorithm for controlling clock generator circuit 120. Examples of algorithms that may be implemented by control circuits 210 include: sigma-delta modulation, running sum of errors, a decimal divider, fractional divide, etc. In the illustrated embodiment, control circuits 210 receive divide value 270 and low-speed input clock 215 as inputs and generate control information or commands based on these inputs. In other embodiments, any of various appropriate circuits such as tri-state buffers, for example, may be used to select a control circuit output instead of a MUX.

In the illustrated embodiment, FIFO 240 provides an interface between control circuits 210 and clock generator circuit 120. FIFO 240 may include any appropriate number of storage entries, such as 2, 4, 8, 32, and so on. In one embodiment, FIFO 240 is configured to receive and store control information from a control circuit 210 via MUX 230 until an amount of stored control data is greater than a threshold (e.g., when FIFO 240 is full or nearly full). In this embodiment, once the threshold is reached, FIFO 240 is configured to send the stored control information to clock generator circuit 130. This embodiment may allow control circuits 210 to run at a slower clock frequency than an embodiment in which no storage elements are included in an interface between a control circuit and a clock generator circuit. In other embodiments, other types of serial and/or parallel interfaces between a control circuit and a clock generator circuit may be used in place of and/or in addition to a FIFO, as desired.

Clock generator circuit 120 may be configured as described above with reference to the similarly numbered element of FIG. 1. In addition, in the illustrated embodiment, clock generator circuit 120 includes LFSR counter 250. In the illustrated embodiment, clock generator circuit 120 receives high-speed input clock 225, counter value 255, and load enable 265 signals as inputs and generates output clock 235 based on these inputs and control information received from FIFO 240. LFSR counter 250 may be configured to count either a first or second number of edges of high-speed input clock 225 based on the control information and clock generator circuit 120 may toggle output clock 225 based on the counting. In other embodiments, clock generator circuit may include other types of counters. LFSR counter 250 is described in further detail below with reference to FIG. 3.

High-speed input clock 225 and low-speed input clock 215 may run at any of various appropriate frequencies. However, in various embodiments, the frequency of high-speed input clock 225 is greater than the frequency of low-speed input clock 215 in order to reduce power consumption in control circuits 210.

In order to program system 200 to generate a particular frequency of output clock 235, the values of divide value 270 and counter value 255 may be programmed. For example, divide value 270 may indicate to control circuits 210 a factor by which high-speed input clock 255 is to be divided in order to produce output clock 235. Divide value 270 may be such a factor, or may encode such a factor. Control circuits 210 may utilize divide value 270 as an input to various algorithms in order to generate control information.

Load enable signal 265 may allow counter value 255 to be loaded into LFSR counter 250 on a given input clock edge. Counter value 255 may be a number of high-speed input clock 225 edges such as N (i.e., a value to count when drawing short). In one embodiment, counter value 255 may specify numbers for both drawing short and drawing long. In another embodiment, counter value 255 specifies only a number N for drawing short and the number for drawing long is known to be N+1, N plus some integer value, etc.

Including multiple control circuits 210 in system 200 and running control circuits 210 at a lower frequency may be beneficial for several reasons. First, control circuits 210 may include complex circuitry to determine how to divide input clock signal 125 to generate output clock signal 135, and running control circuits 110 at a high frequency may consume considerable power. Second, it may be desirable to implement multiple control algorithms while having only one clock generator circuit 120 and implementing multiple control algorithms may allow for experimentation by switching between different control algorithms and comparing the results. Finally, in order to further conserve power, unused control circuits may be put into a low-power state. For example, when MUX 230 is used to select the output of control circuit 210*a*, control circuits 210*b-n* may be powered-down or clock-gated.

In one embodiment, low-speed input clock 215 has an adjustable frequency. This may allow low-speed input clock 215 to be pushed to lower frequencies in order to conserve power, while still providing timely control information to clock generator circuit 120. In one embodiment, FIFO 240 or clock generator circuit 120 is configured to provide an underflow signal to indicate a situation in which control information is not being provided as fast as it is being used by clock generator circuit 120. In this embodiment, system 200 is configured to increase the frequency of low-speed input clock 215 in response to the underflow signal. In other embodiments, FIFO 240 and/or clock generator circuit 120 may generate various information associated with the rate that control information is being provided or consumed. System 200 may adjust the frequency of low-speed input clock 215 based on such information.

Figure 3:
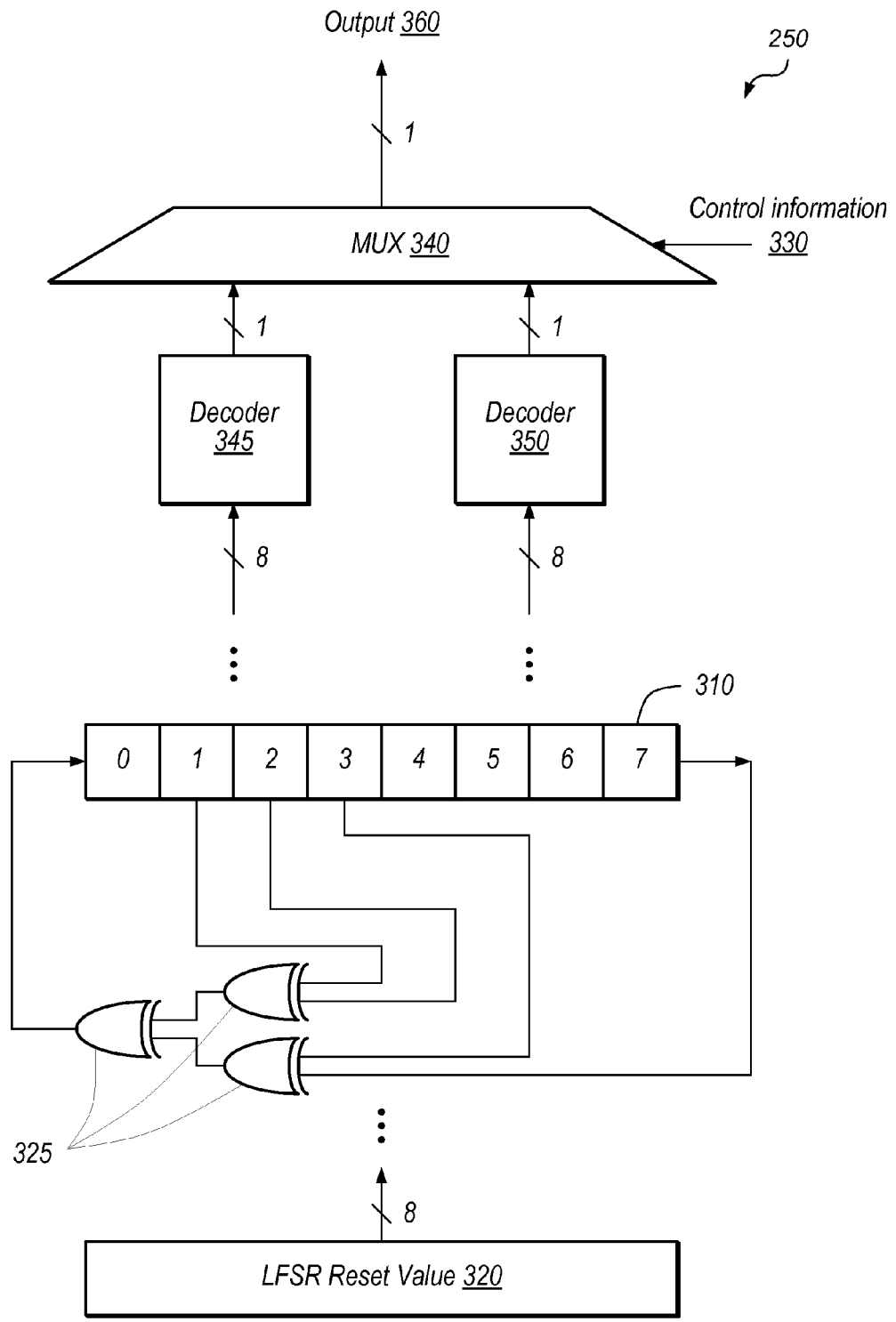
FIG. 3 is a block diagram illustrating one exemplary embodiment of a linear feedback shift register counter.

Referring now to FIG. 3, one exemplary embodiment of a LFSR counter 250 is shown. Other implementations of LFSR counters and/or other types of counters are contemplated, but the embodiment of FIG. 3 illustrates one example configuration for programming and operating a LFSR counter.

In the illustrated embodiment, LFSR counter 250 includes MUX 340, decoders 345 and 350, shift register 310, logic gates 325, and LFSR reset value 320. In the illustrated embodiment, LFSR counter 250 generates output 360, which indicates whether an output clock signal (e.g., output clock signal 135 of FIG. 1) should be toggled on a given input clock edge.

In the illustrated embodiment, LFSR reset value 320 is a storage element. LFSR reset value 320 may be programmed e.g., using the counter value 255 signal as described above with reference to FIG. 2. A "true" value on output 360 may indicate that the value in LFSR reset value 320 should be loaded into shift register 310 in order to begin counting for a next clock pulse.

In the illustrated embodiment, shift register 310 is an 8-bit shift register, but in other embodiments, shift registers having any of various numbers of bits may be implemented. The bits of shift register 310 may be stored using single or dual-edged triggered flip-flop circuits, for example. On a given input clock edge (e.g., on an edge of higher-speed input clock signal 125), the values of each bit may be shifted to the next bit. For example, the value stored at bit 0 is shifted to bit 1, the value in bit 1 is shifted to bit 2, etc., and the output of logic gates 325 is shifted into bit 0. In the illustrated embodiment, logic gates 325 are exclusive-or (XOR) gates. In other embodiments, logic gates may be other types of gates such as exclusive-nor (XNOR) gates.

In the illustrated embodiment, decoders 345 and 350 are configured to detect first and second numbers of clock edges respectively. For example, decoder 345 may be configured to detect when N input clock edges have occurred since a reset of shift register 310 and decoder 350 may be configured to detect when N+1 input clock edges have occurred since a reset of shift register 310 based on the contents of shift register 310.

As one example of utilization of shift register 310, if the illustrated embodiment of shift register 310 is loaded with the initial value 11111111, the value of the register through an initial 10 cycles would be:

| Value: | Cycle: |
| --- | --- |
| 11111111 | 0 |
| 01111111 | 1 |
| 00111111 | 2 |
| 10011111 | 3 |
| 01001111 | 4 |
| 00100111 | 5 |
| 00010011 | 6 |
| 00001001 | 7 |
| 10000100 | 8 |
| 11000010 | 9 |

In general, an M-bit LFSR may be configured to count through $2^M-1$ values before repeating. For example, the illustrated 8-bit LFSR may be configured to count through up to $2^8-1=255$ values.

Consider a simple (exemplary) situation in which a desired N is known to be smaller than or equal to 8 cycles (this simple example uses the limited number of shift values cycles listed above in order to avoid listing all 256 values). In this situation, decoder 345 may be configured to detect a value of 10000100 (cycle 8 in the table above) in shift register 310 and decoder 350 may be configured to detect a value of 11000010 (cycle 9 in the table above). Shift register 310 may then be programmed with a reset value based on a desired value of N ranging from 1 to 8.

Thus, to program LFSR counter 250 with a value of N=5, for example, a value of 10011111 (cycle 3, which is five (N) cycles from the cycle 8 that will be detected by decoder 345) may be stored in LFSR reset value 320. Thus, once the value 10011111 (cycle 3) is sent to shift register 310 in this situation, decoder 345 may detect a match after 5 cycles (N) and decoder 350 may detect a match after 6 cycles (N+1). MUX 340 may select between the output of decoder 345 and 350 based on control information 330 received from a control circuit such as control circuit 110. The output of MUX 340 may be used to indicate that an output clock should be toggled and/or that shift register 310 should be reset using LFSR reset value 320. Thus, a control circuit may control whether an output clock is generated using N or N+1 cycles by sending control information 330 to LFSR counter 250. In some embodiments, decoder 350 is configured to match a last cycle in a pattern generated by a LFSR (e.g., cycle 255 for an 8-bit LFSR) in order to utilize the full counting potential of the LFSR.

In one embodiment, a single decoder may be used to match values in LFSR counter 250. For example, decoder 245 may be configured to detect a match after N cycles. The output of decoder 245 may be provided to MUX 340 after a 1-cycle delay in order to detect a match after N+1 cycles when drawing long. In one embodiment, a flip-flop is used to implement such a 1-cycle delay.

Figure 4:
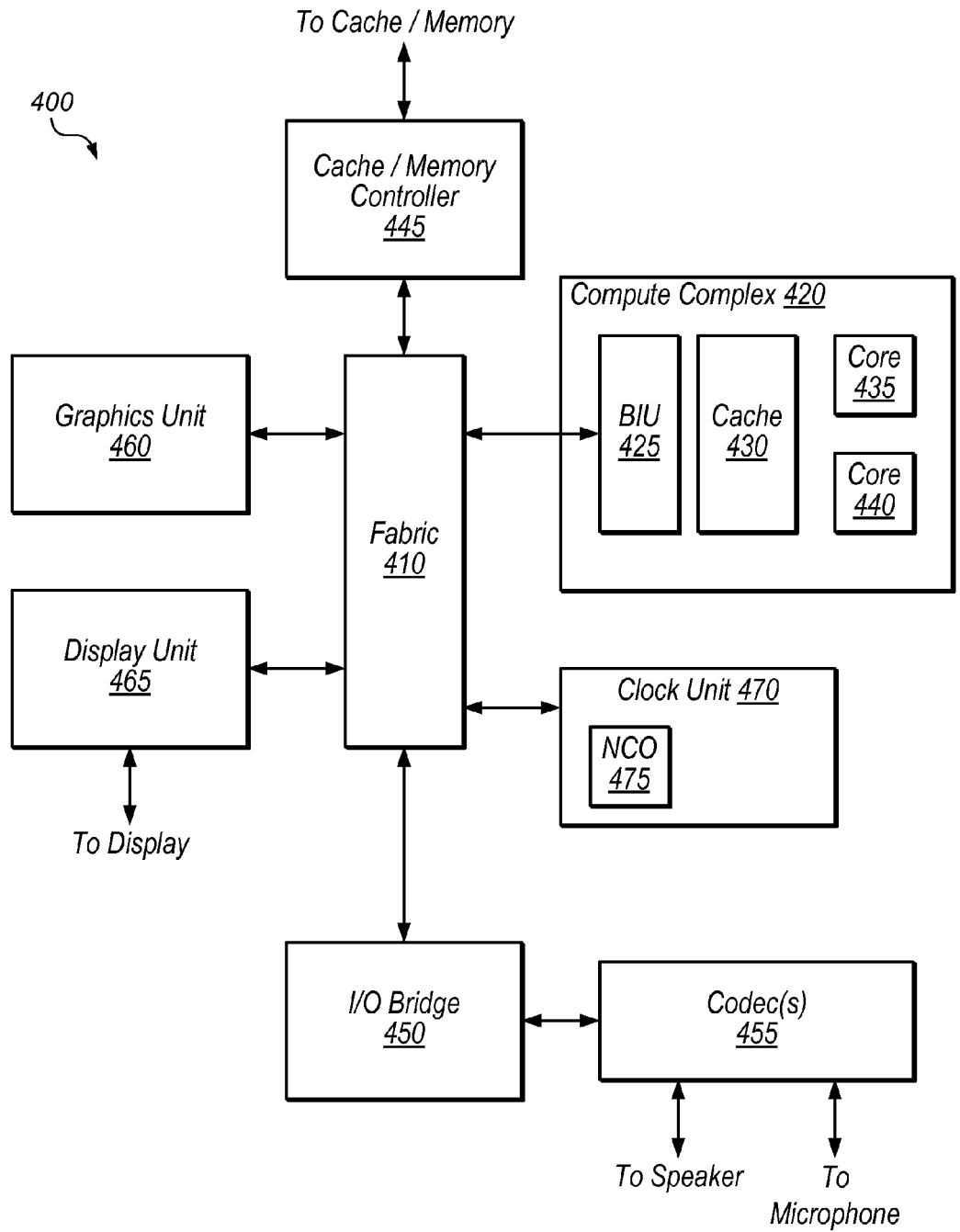
FIG. 4 is a block diagram illustrating one exemplary embodiment of a system that includes a numerically-controlled oscillator.

Referring now to FIG. 4, one exemplary embodiment of a system 400 that includes a NCO is shown. In some embodiments, elements of system 400 may be included in a system on a chip. In the illustrated embodiment, system 400 includes fabric 410, compute complex 420, input/output (I/O) bridge 450, codec(s) 455, cache/memory controller 445, graphics unit 460, display unit 465, and clock unit 470.

Fabric 410 may include various interconnects, buses, MUX's, controllers, etc., and may be configured to facilitate communication between various elements of system 400. In some embodiments, portions of fabric 410 may be configured to implement various different communication protocols. In other embodiments, fabric 410 may implement a single communication protocol and elements coupled to fabric 410 may convert from the single communication protocol to other communication protocols internally.

In the illustrated embodiment, compute complex 420 includes bus interface unit (BIU) 425, cache 430, and cores 435 and 440. In various embodiments, compute complex 420 may include any of various appropriate numbers of cores and/or caches. For example, compute complex 420 may include 1, 2, or 4 processor cores, or any other suitable number. In one embodiment, cache 430 is a set associative L2 cache. In some embodiments, cores 435 and/or 440 may include internal instruction and/or data caches. In some embodiments, a coherency unit (not shown) in fabric 410, cache 430, or elsewhere in system 400 may be configured to maintain coherency between caches of system 400. BIU 425 may be configured to manage communication between compute complex 420 and other elements of system 400. Processor cores such as cores 435 and 440 may be configured to execute instructions of a particular instruction set architecture (ISA) such as ARM®, INTEL® 64, IA-32, AMD 64®, POWERPC®, or MIPS®, for example.

Cache/memory controller 445 may be configured to manage transfer of data between fabric 410 and one or more caches and/or memories. For example, cache/memory controller 445 may be coupled to an L3 cache, which may in turn be coupled to a system memory. In other embodiments, cache/memory controller 445 may be directly coupled to a memory. In some embodiments, cache/memory controller 445 may include one or more internal caches.

As used herein, the term "coupled to" may indicate one or more connections between elements, and a coupling may include intervening elements. For example, in FIG. 2, clock unit 470 may be described as "coupled to" codec(s) 455 through fabric 410 and I/O bridge 450. In contrast, in the illustrated embodiment of FIG. 4, clock unit 470 is "directly coupled" to fabric 410 because there are no intervening elements.

Graphics unit 460 may include one or more processors and/or one or more graphics processing units (GPU's). Graphics unit 460 may receive graphics-oriented instructions, such OPENGL® or DIRECT3D® instructions, for example. Graphics unit 460 may execute GPU instructions or perform other operations based on the received graphics-oriented instructions. Graphics unit 460 may generally be configured to process large blocks of data in parallel and may build images in a frame buffer for output to a display. Graphics unit 460 may include transform, lighting, triangle, and/or rendering engines in one or more graphics processing pipelines. Graphics unit 460 may output pixel information for display images.

Display unit 465 may be configured to read data from a frame buffer and provide a stream of pixel values for display. Display unit 465 may be configured as a display pipeline in some embodiments. Additionally, display unit 465 may be configured to blend multiple frames to produce an output frame. Further, display unit 465 may include one or more interfaces (e.g., MIPI® or embedded display port (eDP)) for coupling to a user display (e.g., a touchscreen or external display).

I/O bridge 450 may include various elements configured to implement: universal serial bus (USB) communications, security, audio, and/or low-power always-on functionality, for example. I/O bridge 450 may be referred to as a "south bridge" in some implementations. I/O bridge 450 may also include interfaces such as pulse-width modulation (PWM), general-purpose input/output (GPIO), serial peripheral interface (SPI), and/or inter-integrated circuit (I2C), for example.

In the illustrated embodiment, codec(s) 455 are coupled to I/O bridge 450 and a speaker and a microphone. Codec(s) 455 may be configured to encode and decode audio information. For example, codec(s) 455 may encode analog audio from a microphone into a digital signal and may decode digital audio into an analog signal to be output by a speaker. In embodiments including a NCO according to the present disclosure, codec(s) 455 may be simplified (and thus less expensive) because of the precision of the NCO with a high-speed clock generator portion.

In the illustrated embodiment, clock unit 470 is coupled to fabric 410 and includes NCO 475. NCO 475 may be configured according to various embodiments described herein. Clock unit 470 may be configured to send clock signals to various elements of system 400. Clock unit 470 may be configured to conserve power in system 410 by clock-gating clock signals to various modules when they are unused. Clock unit 470 may be configured to provide input clocks having different frequencies to NCO 475 (such as low-speed input clock 215 and high-speed include clock 255 of FIG. 2, for example). The output of NCO 475 may be sent to various elements of system 400 and used for various purposes including audio or video encoding/decoding, for example.

In one embodiment, a processing element or circuit such as a power management unit may send a power signal (e.g., power-down signal) to NCO 475. For example, in order to save power, a power management unit may change the power state of NCO 475. As used herein, the term "change the power state" refers to clock gating a circuit, powering-down a circuit, or otherwise changing characteristics of power supplied to the circuit. Before changing its power state, NCO 475 may be configured to finish generating a current output clock period. Alternately, the power management unit may be configured to wait until NCO 475 completes a current output clock period before changing the power state of NCO 475. This may prevent irregular output clock pulses from NCO 475.

Figure 5A:
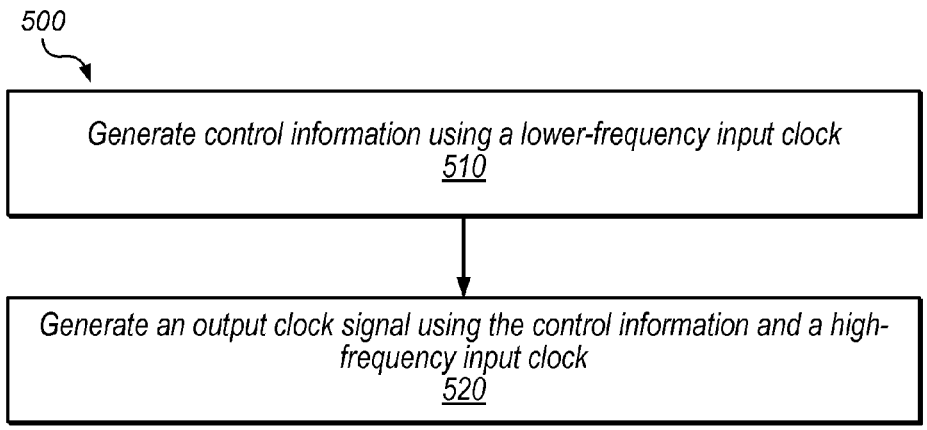
FIG. 5A is a flow diagram illustrating one exemplary embodiment of a method for generating an output clock signal.

Referring now to FIG. 5A, a flow diagram illustrating one embodiment of a method 500 for generating an output clock is shown. The method shown in FIG. 5A may be used in conjunction with any of the computer systems, devices, elements, or components disclosed herein, among other devices. In other embodiments, some of the method elements shown may be performed concurrently, in a different order than shown, or may be omitted. Additional method elements may also be performed as desired. Flow begins at block 510.

At block 510, control information is generated using a lower-frequency input clock. In one embodiment, control circuit 110 generates information indicating whether clock generator circuit 120 should draw short or draw long. The control information may be sent directly to clock generator 120 or may be aggregated and then sent (e.g., using FIFO 240). The control information may dither between indication of drawing short and drawing long in order to avoid a pattern and thus avoid audio artifacts, for example. Flow proceeds to block 520.

At block 520, an output clock signal is generated using the control information and a high-frequency input clock. In one embodiment, clock generator circuit 120 counts either a first number or a second number of high-frequency input clock edges before toggling a generated output clock signal based on the control information. An output clock signal may be generated using multiple iterations of method 500 and may have a desired frequency, on average. Flow ends at block 520.

Figure 5B:
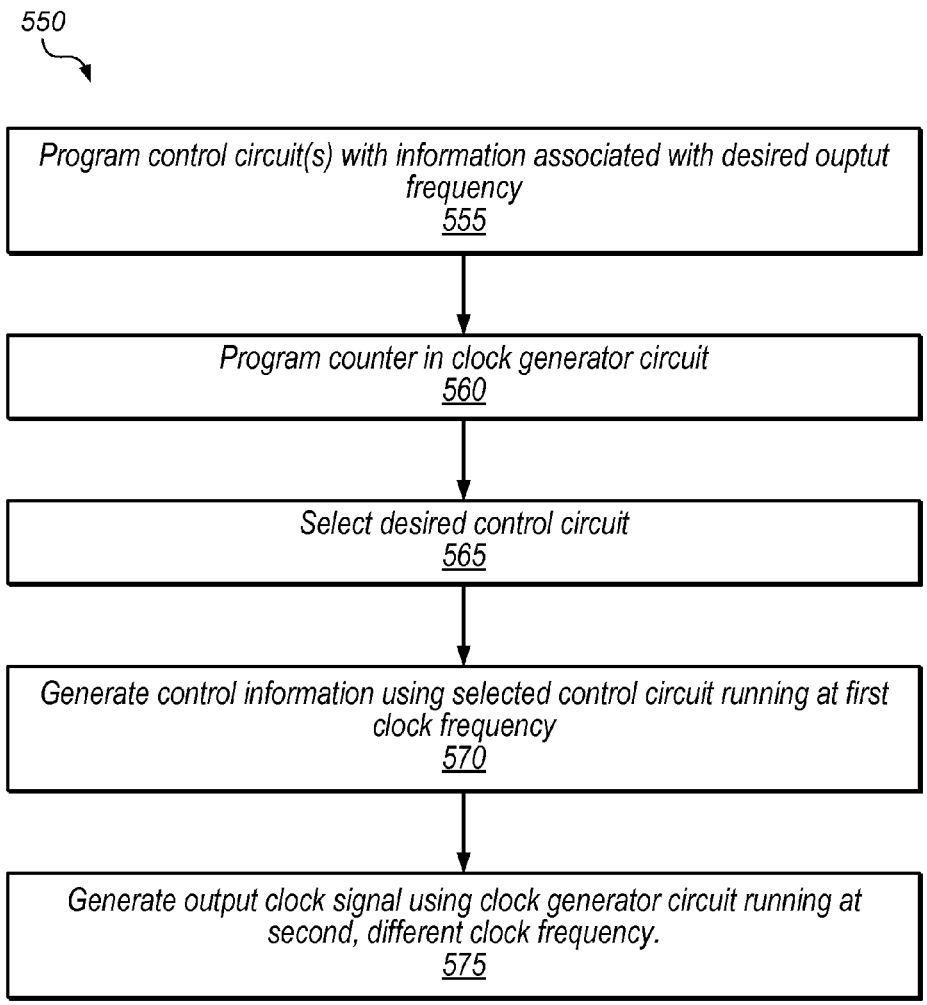
FIG. 5B is a flow diagram illustrating another exemplary embodiment of a method for generating an output clock signal.

Referring now to FIG. 5B, one embodiment of a method 550 for generating an output clock is shown. The method shown in FIG. 5B may be used in conjunction with any of the computer systems, devices, elements, or components disclosed herein, among other devices. In other embodiments, some of the method elements shown may be performed concurrently, in a different order than shown, or may be omitted. Additional method elements may also be performed as desired. Flow begins at block 555.

At block 555, control circuit(s) are programmed with information associated with a desired output frequency. For example, control circuits 210 may be programmed with an amount by which high-speed input clock 225 should be divided in order to produce output clock 235. The information may be encoded using various formats. For example, in one embodiment the information is specified as a desired output clock frequency. In another embodiment, the information includes an integer part and a decimal part of a number of input clock edges that are desired to correspond to each output clock pulse. In other embodiments, the information may be specified as parameters to a particular control circuit algorithm. Flow proceeds to block 560.

At block 560, a counter in a clock generator circuit is programmed. For example, LFSR reset value 320 may be programmed with a reset value for shift register 310. The value programmed into the counter may be based on the amount by which an input clock should be divided in order to produce a desired output clock. Flow proceeds to block 565.

At block 565, a control circuit is selected. This step may be performed by a MUX, by tri-state logic, or by some other circuit. In some embodiments, this step may be performed in conjunction with step 555. For example, the desired control circuit may be selected by programming it with information associated with the desired output frequency and other control circuits (if present) may not be programmed in order to conserve power. In some embodiments, unselected control circuits may be powered-down or clock gated in order to reduce power consumption. Flow proceeds to block 570.

At block 570, control information is generated by the selected control circuit running at a first clock frequency. The control information may be generated according to various algorithms, as desired. The control information may be generated in order to maintain a desired frequency, on average, while avoiding patterns in changes between drawing short and drawing long by a clock generator circuit. Flow proceeds to block 575.

At block 575, an output clock signal is generated using a clock generator circuit running at a second, different clock frequency. The second clock frequency may be greater than the first clock frequency. For example, a clock generator circuit may toggle an output clock based on the control information as described above with reference to FIG. 5A. Flow ends at block 575.

Figures 6A, 6B:
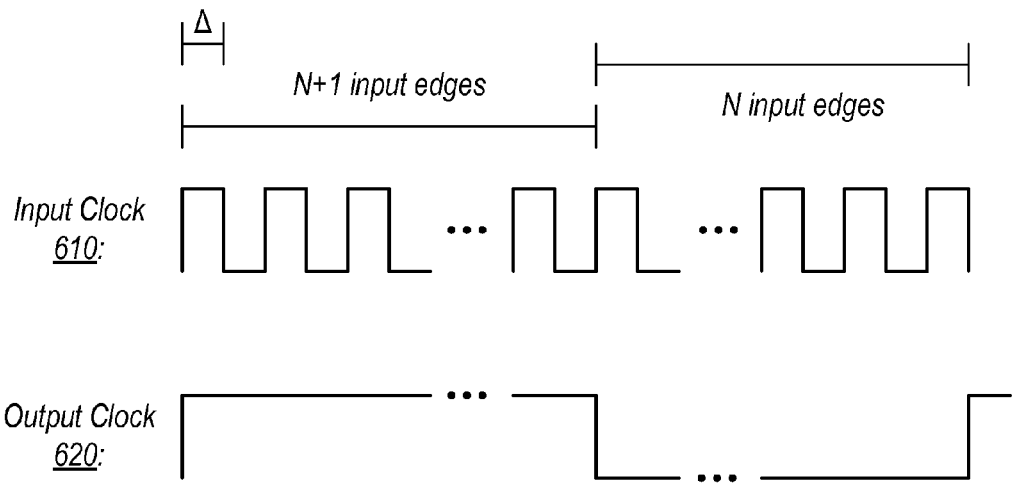
FIGS. 6A and 6B are diagrams illustrating non-limiting examples of generating control information for a numerically-controlled oscillator.

Referring now to FIG. 6A, one example of generating an output clock using a NCO is shown. In the illustrated embodiment, output clock 620 is generated using both N and N+1 input edges of input clock 610 to determine output pulse lengths.

In the illustrated embodiment, the frequency (f) of the input clock is 2400 MHz. The duration of a half-cycle of the input clock is $\Delta=1/(2f)=208.333$ picoseconds (ps) in this example.

Common exemplary families of clock frequencies for audio encoding include:

8, 16, 32, and 64 kHz
11.025, 22.05, 44.1, 88.2, and 176.4 kHz
12, 24, 48, 96, and 192 kHz These common clock frequencies are generally scaled by a multiplier such as: 64, 96, 128, 192, 256, 384, 512, 768, or 1024, for example. Thus, desired NCO output for these families may range from 512 kHz to 196.6 MHz.

In this exemplary embodiment, the desired output clock frequency is 128×44.1 kHz=5.6448 MHz. Thus, the desired period of the output clock is $T=1/g=(2f/g)\Delta=850.3402\Delta$, and the desired duration of a half-cycle of the output clock is $425.1701\Delta$. These terms are specified in terms of $\Delta$ because the output clock pulses may be thought of as built of pieces of length $\Delta$. In the illustrated example, this desired half-cycle duration is split into an integer part N=425 and decimal part $\phi=0.1701$. In the illustrated embodiment, in order to generate an output clock having a half-cycle duration of $425.1701\Delta$ (425.1701 input clock half-cycles) on average, NCO 475 is configured to alternate between toggling output clock 620 every N (425) input clock edges and every N+1 (426) input clock edges.

Using the example above, one exemplary algorithm of a control circuit would instruct the clock generator circuit to draw short (use N=425 input clock edges for each output clock pulse) until an accumulation of the decimal part $\phi$ reaches some threshold. This approach generates the following pattern for this example (using a threshold of 1):

Draw short Accumulation=0.1701
Draw short Accumulation=0.3402
Draw short Accumulation=0.5103

Draw short Accumulation=0.6804
Draw short Accumulation=0.8505
Draw long Accumulation=1.0206 (threshold reached)
Draw short Accumulation=0.1907

In one embodiment, when the threshold of 1 is reached, the control circuit indicates that the clock generator should draw long (use N+1=426 input clock edges for each output clock pulse). In this example, the control circuit drops the integer part of the next accumulation (to produce 0.1907) and continues accumulating until the threshold is reached again (and a draw long is indicated). In the illustrated embodiment, the decimal part is accumulated every half clock period of the output clock. In other embodiments, the decimal part may be accumulated every clock period of the output clock. Other control circuits may implement other algorithms for determining when to draw short and draw long, including sigma-delta modulation, for example. A sigma-delta modulator may create a stream of pulses based on a voltage signal using feedback, for example, in order to decide when to draw short or draw long.

Referring now to FIG. 6B, two sequences of control information are shown. An 'L' refers to an indication to draw long and 'S' refers to an indication to draw short. One drawback to the approach of FIG. 6A is that it may generate a pattern of drawing short and drawing long and may cause artifacts in encoded audio, for example. Such a pattern is shown in the upper sequence of FIG. 6B, in which a pattern of five S's alternate with an L. In the lower sequence of FIG. 6B, the pattern has been broken up because a different algorithm has been used to generate the sequence of control information. The algorithm may be random or pseudo-random to obtain this result of breaking up a pattern of drawing long and drawing short. The lower sequence may result in fewer artifacts in audio applications than the upper sequence. In some situations, it may be desirable to test multiple algorithms for generating sequences of control information on the same system. Thus, in embodiments such as that of FIG. 2, different control circuits may be programmed with different algorithms in order to perform such experimentation.

* * *

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
    generating, by a control circuit, control information based on a first input clock signal;
    generating, by a clock generator circuit, an output clock signal, wherein the generating uses either a first number of edges of a second input clock signal or a second, different number of edges of the second input clock signal for pulses of the output clock signal based on the control information, wherein the second input clock signal has a frequency that is greater than a frequency of the first input clock signal;
    determining that the control circuit is generating information at a rate that is different than a rate at which the information is being used by the clock generator circuit; and
    adjusting a rate of the first input clock signal in response to the determining.

2. The method of claim 1, further comprising:
    storing the control information using an interface circuit;
    determining that the stored control information is greater than a threshold amount of information; and
    sending the stored control information to the clock generator circuit in response to the determining.

3. The method of claim 1, wherein the generating includes:
    counting either the first number of edges or the second number of edges based on the control information; and
    toggling the output clock signal based on said counting.

4. The method of claim 1, wherein the second number of edges is equal to the first number of edges plus one.

5. A numerically-controlled oscillator, comprising:
    a control circuit configured to generate control information using a first input clock; and
    a clock generator circuit configured to generate an output clock pulse having an interval corresponding to a number of edges of a second input clock, wherein the number of edges is based on control information and is either an integer N or N+1; and
    circuitry configured to determine that the control circuit is generating information at a rate that is different than a rate at which the information is being used by the clock generator circuit and adjust a rate of the first input clock in response to the determination;
    wherein a frequency of the second input clock is greater than a frequency of the first input clock.

6. The numerically-controlled oscillator of claim 5, wherein the clock generator circuit includes a linear feedback shift register counter configured to count either the N edges or the N+1 edges of the second input clock and toggle an output clock based on the counting.

7. The numerically-controlled oscillator of claim 5, further comprising:
    an interface circuit coupled to the clock generator circuit and the control circuit, wherein the interface circuit is configured to:
    receive and store control information from the control circuit;
    make a determination that an amount of the stored control information is greater than a threshold; and
    send the stored control information to the clock generator circuit based on the determination.

8. The numerically-controlled oscillator of claim 5, wherein, in response to a power signal from a power-management circuit, the clock generator circuit is configured to generate a remainder of an output clock period before changing its power state.

9. An apparatus, comprising:
a clock generator circuit configured to generate an output clock signal using either a first number of edges of an input clock signal or a second, different number of edges of the input clock signal for pulses of the output clock signal based on control information;
control circuitry configured to generate the control information, wherein the control circuitry is configured to run at a particular frequency that is less than a frequency of the input clock signal; and
an interface circuit coupled to the clock generator circuit and the control circuit, wherein the interface circuit is configured to:
receive and store control information from the control circuit;
make a determination that an amount of the stored control information is greater than a threshold; and
send the stored control information to the clock generator circuit based on the determination.

10. The apparatus of claim 9, wherein the apparatus is configured to determine that the control circuit is generating information at a rate that is different than a rate at which the information is being used by the clock generator circuit and adjust the particular frequency in response to the determination.

11. The apparatus of claim 9, wherein the apparatus is a numerically-controlled oscillator.

12. The apparatus of claim 9, wherein the clock generator circuit includes a counter configured to count either the first number of edges of the second number of edges of the input clock signal and change a level of the output clock signal based on the counting.

13. The apparatus of claim 9, wherein the second number of edges is the first number of edges plus one.

14. An apparatus, comprising:
a control circuit configured to run at a first clock frequency;
a clock generator circuit coupled to the control circuit and configured to run at a second, higher clock frequency, wherein the clock generator circuit is configured to generate pulses of an output clock signal having either a first duration or a second duration based on control information received from the control circuit; and
counter circuitry, wherein the apparatus is configured to program the counter circuitry with the first duration and the second duration based on a desired average frequency of the output clock signal.

15. The apparatus of claim 14, wherein the control circuit is configured to implement sigma-delta modulation to generate the control information.

16. The apparatus of claim 14, further comprising a storage element configured to:
store control information generated by the control circuit; and
send the stored control information to the clock generator circuit in response to the storage element reaching a storage threshold.

17. The apparatus of claim 14, wherein the apparatus is configured to digitize an audio signal based on the output clock signal.

18. A method, comprising:
programming counter circuitry that includes a linear feedback shift register with a first number of input clock edges and a second number of input clock edges, wherein the first and second numbers of input clock edges are based on a desired average frequency for an output clock;
determining, by a control circuit running at a first frequency, whether to count the first number of edges of an input clock or the second number of edges of the input clock to generate an output clock pulse;
counting, by a clock generator circuit, based on the counter circuitry, a specified number of input clock edges, wherein the specified number is based on said determining; and
changing, by the clock generator circuit, a value of an output clock based on said counting in order to generate the output clock pulse;
wherein the input clock has a frequency that is greater than the first frequency.

19. The method of claim 18, wherein the determining is based on a pseudo-random algorithm.

20. The method of claim 18, wherein the determining is based on an algorithm that varies a pattern in a sequence of output clock pulses, wherein the pattern is a pattern of longer and shorter output clock pulses, each generated using either the first number or the second number of input clock edges.

21. The method of claim 18, further comprising digitizing an analog audio signal based on an edge of the output clock pulse.

22. The method of claim 18, further comprising:
adjusting a clock in response to an indication generated by the clock generator circuit, wherein the adjusting causes the control circuit to run at a third frequency.

23. The method of claim 18, wherein the determining is based on a sigma-delta modulator function implemented by the control circuit.

* * * * *